United States Patent
Guha et al.

(10) Patent No.: US 8,784,676 B2
(45) Date of Patent: Jul. 22, 2014

(54) WAFERLESS AUTO CONDITIONING

(75) Inventors: Joydeep Guha, Fremont, CA (US); Sanket Sant, Fremont, CA (US); Butsurin Jinnai, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 175 days.

(21) Appl. No.: 13/365,955

(22) Filed: Feb. 3, 2012

(65) Prior Publication Data

US 2013/0203255 A1  Aug. 8, 2013

(51) Int. Cl.
*H01L 21/306* (2006.01)

(52) U.S. Cl.
USPC ............ 216/37; 216/75; 438/706; 438/905; 134/8; 134/11; 134/22.1

(58) Field of Classification Search
None
See application file for complete search history.

(56) References Cited

U.S. PATENT DOCUMENTS

| | | | |
|---|---|---|---|
| 6,770,567 B2 | 8/2004 | Ko et al. | |
| 6,776,851 B1 | 8/2004 | Singh et al. | |
| 7,223,321 B1 | 5/2007 | Comendant et al. | |
| 2003/0013314 A1 | 1/2003 | Ying et al. | |
| 2003/0205237 A1* | 11/2003 | Sakuma | 134/1.1 |
| 2006/0019493 A1* | 1/2006 | Li | 438/680 |
| 2006/0032516 A1* | 2/2006 | Kundalgurki et al. | 134/1.1 |
| 2006/0191555 A1* | 8/2006 | Yoshida et al. | 134/1.1 |

* cited by examiner

*Primary Examiner* — Allan Olsen
(74) *Attorney, Agent, or Firm* — Beyer Law Group LLP

(57) ABSTRACT

A method for reducing contamination in an etch chamber is provided. A substrate with a metal containing layer is placed in the etch chamber. The metal containing layer is etched, producing nonvolatile metal residue deposits on surfaces of the etch chamber, wherein some of the metal residue of the metal residue deposits is in a first state. The substrate is removed from the etch chamber. The chamber is conditioned by converting metal residue in the first state to metal residue in a second state, where metal residue in the second state has stronger adhesion to surfaces of the etch chamber than metal residue in the first state.

18 Claims, 5 Drawing Sheets

WAFERLESS AUTO CONDITIONING

BACKGROUND OF THE INVENTION

Field of the Invention

The invention relates to a method of forming semiconductor devices on a semiconductor wafer. More specifically, the invention relates to maintaining an etch chamber for etching metal containing layers for the production of Magnetic Random Access Memory (MRAM).

In forming semiconductor devices, metal containing layers are etched. Such etching provides metal containing contaminants within an etch chamber.

SUMMARY OF THE INVENTION

To achieve the foregoing and in accordance with the purpose of the present invention, a method for reducing contamination in an etch chamber is provided. A substrate with a metal containing layer is placed in the etch chamber. The metal containing layer is etched, producing nonvolatile metal residue deposits on surfaces of the etch chamber, wherein some of the metal residue of the metal residue deposits is in a first state. The substrate is removed from the etch chamber. The chamber is conditioned by converting metal residue in the first state to metal residue in a second state, where metal residue in the second state has stronger adhesion to surfaces of the etch chamber than metal residue in the first state.

In another manifestation of the invention, a method for reducing contamination in an etch chamber with a power window and a Faraday shield adjacent to the power window is provided. A substrate with a metal containing layer is placed in the etch chamber. The metal containing layer is etched, producing nonvolatile metal residue deposits on surfaces of the etch chamber including the Faraday shield, wherein the metal residue comprises a metal hydride or metal nitride, wherein the etching comprises providing a chemical reaction of the metal in the metal containing layer, and sputtering the chemically reacted metal in the metal containing layer. The substrate is removed from the etch chamber. The chamber is conditioned by converting metal residue which comprises the metal hydride or metal nitride to a native state metal, where native state metal has stronger adhesion to surfaces of the etch chamber than the metal hydride or metal nitride, comprising providing an oxidation to convert the metal nitride or metal hydride to a metal oxide and providing a reduction to convert the metal oxide to native state metal.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
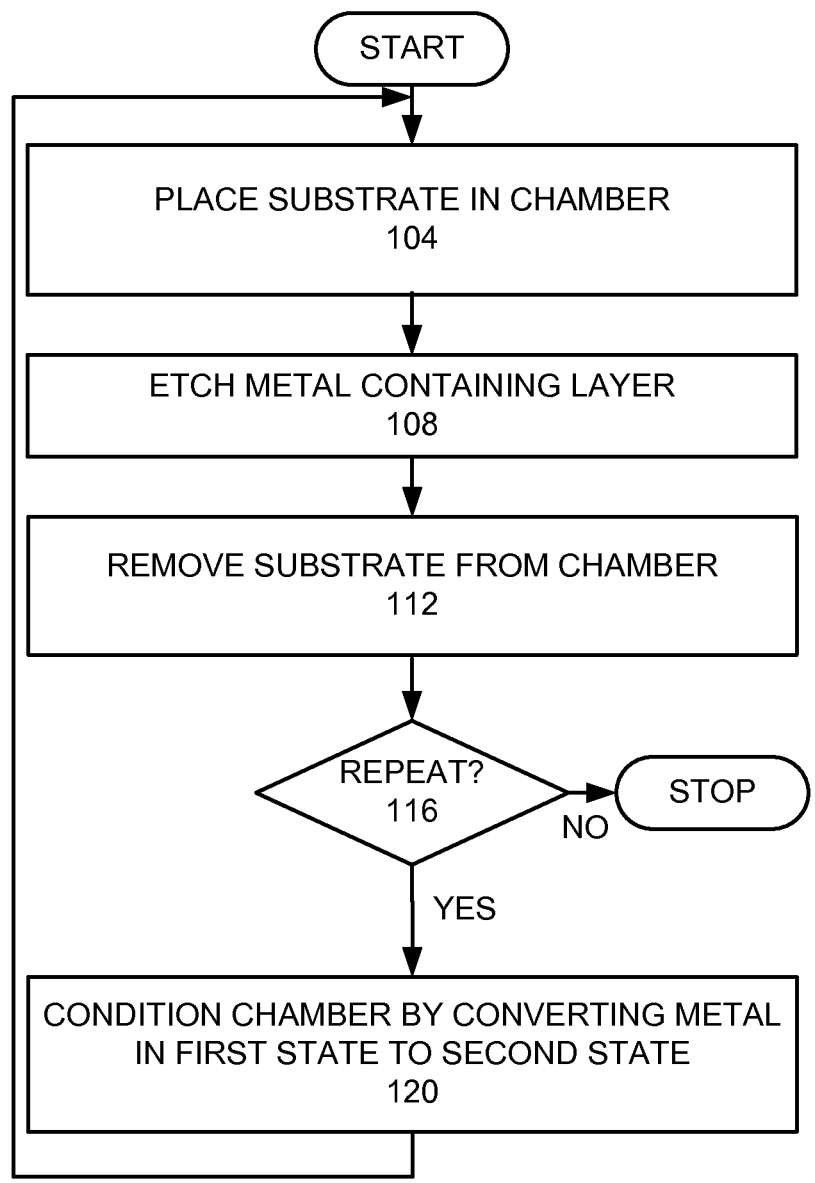
FIG. 1 is a flow chart of an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Magnetic Random Access Memory (MRAM) has gained prominence in recent years as universal memory and has been claimed to replace DRAM, Flash, and SRAM memory. MRAM stacks consist of materials like Co/Fe/Pd/Pt/Ru/Ta/Ti/Ni/Mg/Mn and their alloys. An obstacle in etching these materials is the non volatile nature of the etch byproducts that are formed when plasma species react with these metal surfaces. Non-volatile etch byproducts mean that vapor pressure of these etch byproduct species are so low that they cannot go into the gas phase at operating wafer temperatures (10-250° C.) and pressure (1-50 mTorr).

Due to the non volatile nature of etch byproducts, once these products are sputtered off the wafer surface, they stick to line of sight areas on chamber walls that includes the transformer coupled plasma (TCP) window, pinnacle, and liner. In the formation of semiconductor devices, metal layers may be etched within an etch chamber. It has been found that a significant portion of the metallic etch byproducts deposit on the dielectric TCP window, which interferes with radio frequency (RF) power coupling from the TCP coil to plasma through the dielectric window, and prohibits/degrades etching of MRAM wafers. It has been found that the bias power, which is proportional to plasma density and is a measure of RF coupling through the TCP dielectric window for controlled bias voltage operation mode, dropped when MRAM material wafers were cycled through a TCP reactor.

Etch chambers may be run in a deposition mode, which means that etch byproducts on the chamber walls are not cleared after every wafer etch and are allowed to build up on chamber walls. A $NH_3$ based process has been developed to etch MRAM material. In a cycling marathon using a $NH_3$ based process on CoFe, it was found that after 10 hours using 13.56 MHz RF of metal cycling using CoFe blanket wafers, when the chamber was opened, loose residues in the form of black powder was observed. Such residues impact proper functionality of the chamber over processing time and can lead to process failure and early wet clean (hardware replacement). Formation of such residues can prove detrimental to the lifetime of parts like the electrostatic chuck, liners, chamber walls, and in general, any hardware exposed to plasma, as well as prove hazardous for personal safety to users working on chamber maintenance. Embodiments of the invention reduce the flaking of such residues without impacting the process functionality, which would cause drifts in hardware and process operating regime.

FIG. 1 is a high level flow chart of an embodiment of the invention. In this embodiment, a substrate with a metal containing etch layer is placed in an etch chamber (step 104). The metal containing etch layer is etched (step 108). The substrate is removed from the etch chamber (step 112). If another substrate is to be processed (step 116), then the etch chamber is conditioned by converting metal residue in a first state to metal residue in a second state, where the metal residue in the second state has stronger adhesion to surfaces than the adhesion of metal residue in the first state (step 120). The process is continued until a plurality of substrates is processed. When the substrates are completed, the cyclical process is stopped. Other processes, such as a chamber clean may then be carried out.

EXAMPLE

Figure 2:
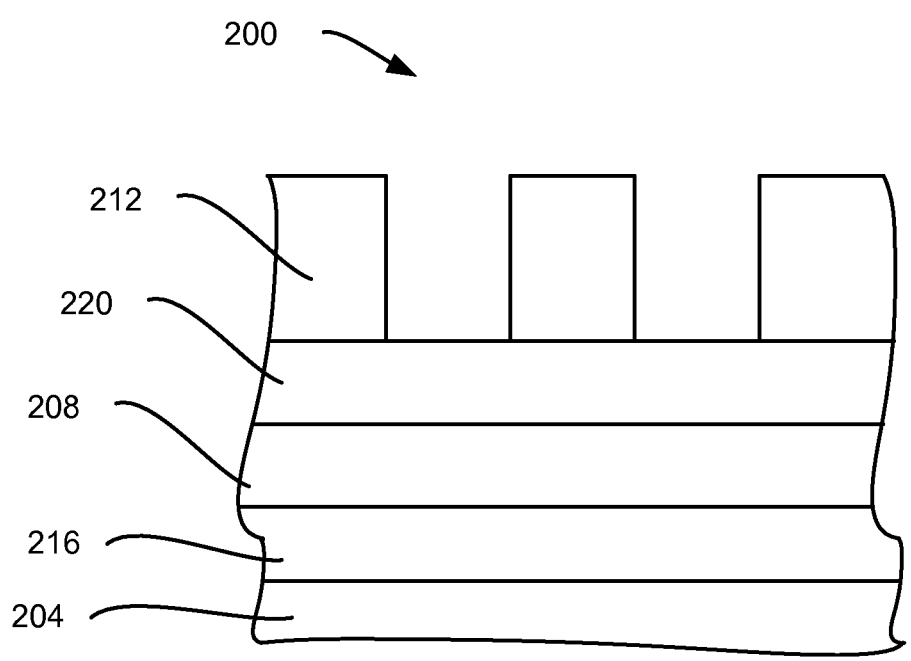
FIG. 2 is a schematic cross-sectional view of a stack that would be used for forming MRAM.

In a preferred embodiment of the invention, a substrate with a CoFe layer is placed in a TCP plasma etch chamber (step 104). FIG. 2 is a schematic cross-sectional view of a stack 200 with a substrate 204 with a CoFe etch layer 208 disposed below a mask 212. In this example, one or more layers 216, 220 may be disposed between the substrate 204 and the CoFe etch layer 208 or the CoFe etch layer 208 and the mask 212. Although in the manufacture of MRAM a mask is placed over the CoFe etch layer 208, in tests of the inventive process, a blanket CoFe etch layer is place over a substrate, without a mask.

Figure 3:
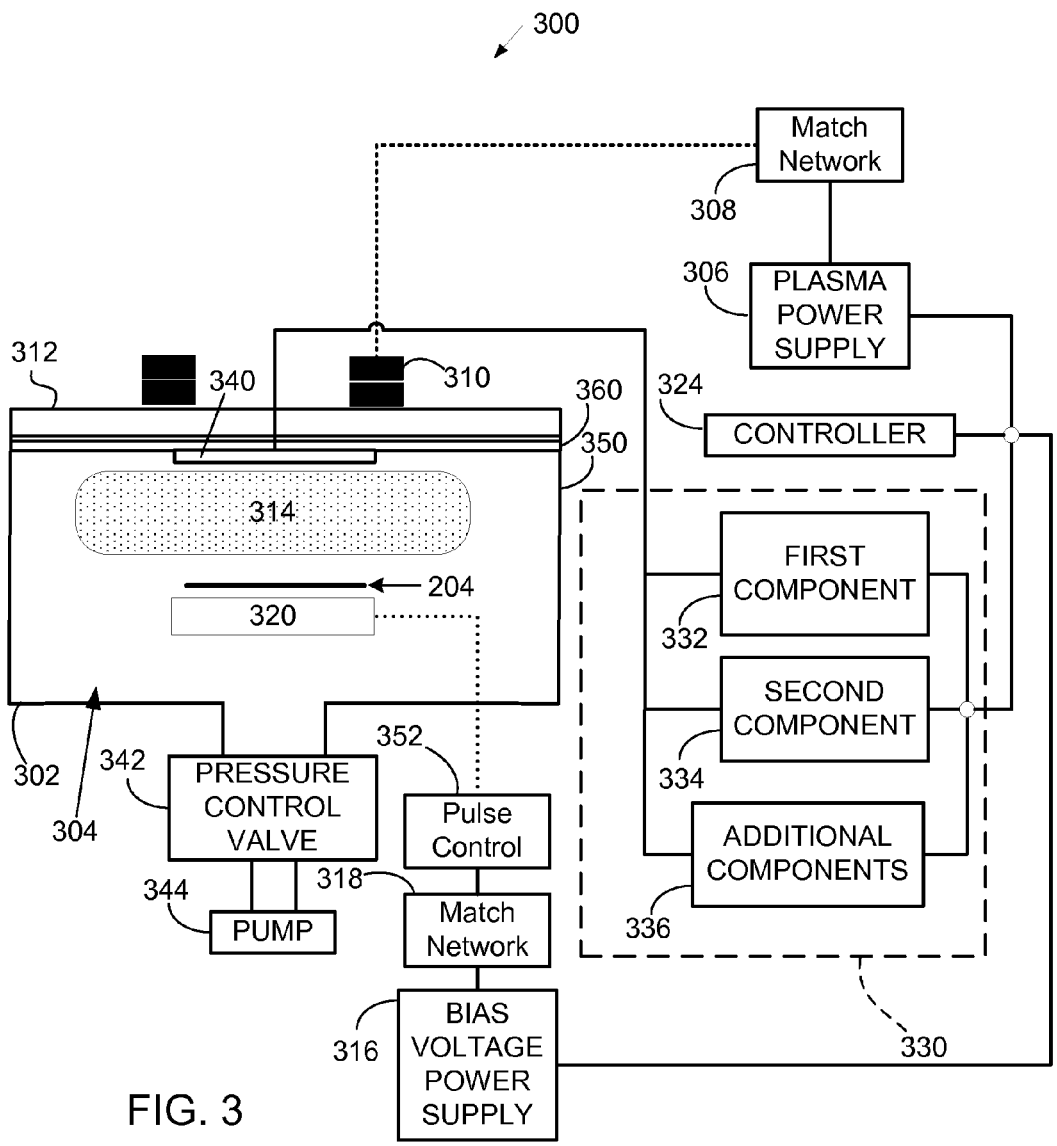
FIG. 3 is a schematic view of a plasma processing chamber that may be used in an embodiment of the invention.

FIG. 3 schematically illustrates an example of a plasma processing system 300 which may be used in one embodiment of the present invention. The plasma processing system 300 includes a plasma reactor 302 having a plasma processing chamber 304 therein defined by a chamber wall 350. A plasma power supply 306, tuned by a match network 308, supplies power to a TCP coil 310 located near a power window 312 to be an electrode that provides power to the plasma processing chamber 304 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A Faraday shield 360 is placed between the power window 312 and the plasma 314. A Faraday shield is described in U.S. Pat. No. 7,223,321, which is incorporated by reference for all purposes. A wafer bias voltage power supply 316 tuned by a match network 318 provides power to an electrode 320 to set the bias voltage on the silicon substrate 204 which is supported by the electrode 320, so that the electrode 320 in this embodiment is also a substrate support. A pulse controller 352 causes the bias voltage to be pulsed. The pulse controller 352 may be between the match network 318 and the substrate support or between the bias voltage power supply 316 and the match network 318 or between the controller 324 and the bias voltage power supply 316 or in some other configuration to cause the bias voltage to be pulsed. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage in a range of 10 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a first component gas source 332, a second component gas source 334, and optionally additional component gas sources 336. The various component gases will be discussed below. The gas sources 332, 334, and 336 are in fluid connection with processing chamber 304 through a gas inlet 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342, which is a pressure regulator, and a pump 344, which also serves to maintain a particular pressure within the plasma processing chamber 304 and also provides a gas outlet. The gas source/gas supply mechanism 330 is controlled by the controller 324. A Kiyo system by Lam Research Corporation may be used to practice an embodiment of the invention.

Figure 4:
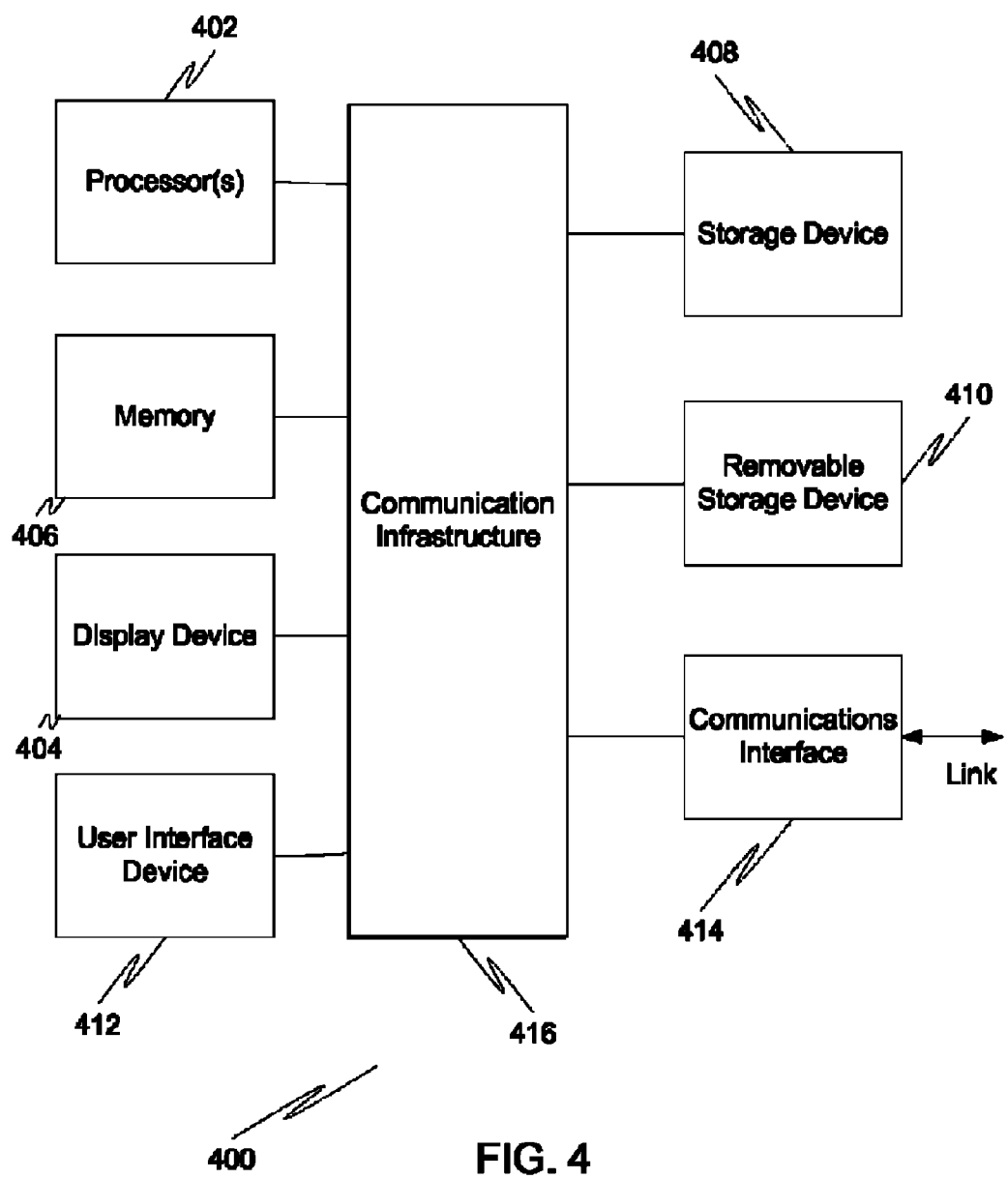
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The CoFe layer is etched (step 108). Preferably, the CoFe layer etch first chemically reacts the metal, such as forming a metal hydride or metal nitride, and then sputters the chemically reacted metal. As a result, chemically reacted metal residues, such as metal hydrides or metal nitrides, are deposited around the chamber in a line of sight from the substrate. Such metal hydrides and metal nitrides tend to flake and contaminate the substrate.

An example of an etch process used to etch the CoFe layer provides a pressure of 2 mTorr. An etch gas of 100 sccm $NH_3$ is flowed into the chamber while a temperature of 120° C. is provided. 1500 watts of RF power is provided to form the etch gas into a plasma. A bias of 1000 volts is provided to provide a sputtering.

Figure 5:
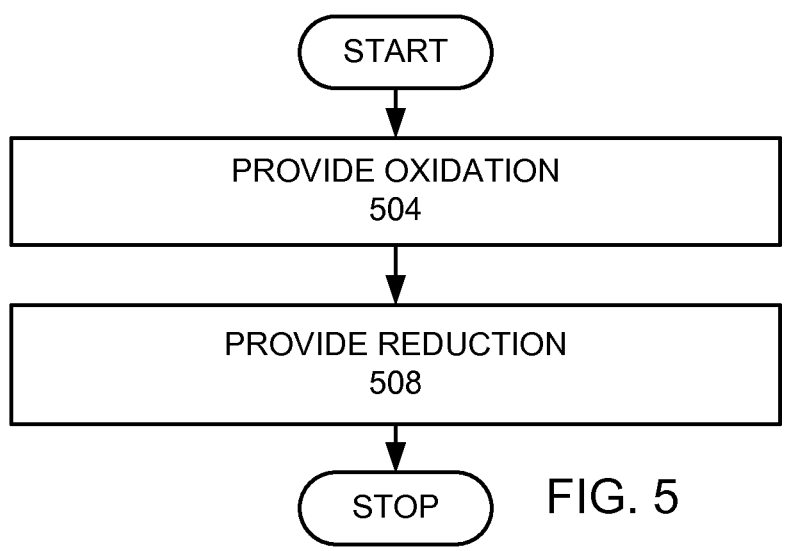
FIG. 5 is a more detailed flow chart of conditioning the chamber step.

The substrate is removed from the etch chamber (step 112). If another substrate is to be processed (step 116) the chamber is conditioned by converting the metal residue in a first state to a second state (step 120), where metal residue in the second state has stronger adhesion to surfaces of the etch chamber than metal in the first state. FIG. 5 is a more detailed flow chart of an embodiment of the invention for conditioning the chamber (step 120). In this embodiment to convert the metal residue in a first state to a second state, first an oxidation is provided (step 504). During this step, metal nitrides and metal hydrides are converted to metal oxides. Then a reduction is provided (step 508) to convert the metal oxides to native state metals (step 508).

In a specific example of a recipe for providing an oxidation (step 504), the pressure in the etch chamber is set to greater than 5 mTorr and a flow of 70 sccm $O_2$ and greater than 30 sccm $Cl_2$ is flowed into the etch chamber. TCP power is provided at 13.56 MHz at a power greater than 500 watts. Another example of a recipe flows 20 sccm CO and 80 sccm $NF_3$ into the etch chamber.

In other embodiments, the oxidation step may flow an oxygen containing gas such as $O_2$ or CO. The oxygen containing gas must have sufficient oxygen to oxidize the metal containing residue.

In other embodiments of the invention, the first state is a metal oxide. In such an embodiment, only one step is used to reduce the metal oxide to elemental metal. In other embodiments, the second state is not elemental metal. In one embodiment, the metal is in a native state. A native state metal is a metal that is either an elemental metal or an alloy of different elemental metals, so that the metals are not ions with no reactivity. Examples of metals in a native state may be metal alloy or mixture layers of Co, Fe, Ru, Pd on the wall such that they form a good metal film that has good adhesion strengths. For example, a native state metal may be a CoFe alloy. In such embodiments the metals will be in either elemental state as pure stand alone metal or a mix like CoPd film or FeTi film etc.

In other embodiments, other etch chambers such as a capacitively coupled etch chamber may be used.

In another embodiment of the invention, the metal residue is iron nitride. The oxidation treatment converts the iron nitride to iron oxide. The hydrogen reduction converts the iron oxide to elemental iron. In different embodiments, different methods may be used to provide the reduction. For example a metal oxide may be heated to drive out oxygen to provide native state metal. In another embodiment, irradiation is provided to convert a metal oxide to native state metal.

In another embodiment, the oxidation and hydrogen reduction are performed during a single process. In another embodiment, another substrate is placed in the chamber and the conditioning is performed while the substrate is in the etch chamber.

The elemental metal has been found to adhere better to the chamber walls than metal hydrides and metal nitrides. In addition, it has been found that subsequent depositions adhere better to the elemental metal than metal hydrides and metal nitrides.

In addition, it has been found in embodiments of the invention that the changing of the metal residues allows for a more stable etch process. In embodiments of the invention such stable etch processes have no process drifts and no loose particle formation.

The wet clean replaces the parts for new or clean parts. The dirty parts are then sent for chemical treatment or acid cleans. The elemental metal does not reduce transmission of the window because, the Faraday shield 360 is placed in the chamber right below the window 312. This shield 360 is grounded and has slits in it. The shield has two purposes: first the shield stops the nonvolatile byproducts from reaching the TCP window and second the shield allows the electromagnetic fields to pass through and create plasma. Since this shield is grounded, all the metal residue deposits on it. An embodiment of the invention prevents the metal residue deposits from flaking off or forming loose particles that would fall on the wafer.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for reducing contamination in an etch chamber, comprising:
   placing a substrate with a metal containing layer in the etch chamber;
   etching the metal containing layer, producing nonvolatile metal residue deposits on surfaces of the etch chamber, wherein some of the metal residue of the metal residue is in a first state;
   removing the substrate from the etch chamber; and
   conditioning the chamber by converting metal residue in the first state to metal residue in a second state, where metal residue in the second state has stronger adhesion to surfaces of the etch chamber than metal residue in the first state,
   wherein the metal residue in the first state is at least one of metal nitrides or metal hydrides and wherein metal residue in the second state is a native state metal.

2. The method, as recited in 1, wherein the conditioning the chamber, comprises:
   providing an oxidation to convert the at least one of metal nitrides or metal hydrides to a metal oxide; and
   providing a reduction to convert the metal oxide to native state metal.

3. The method, as recited in claim 2, wherein the providing a reduction is at least one of providing a hydrogen reduction, reduction by heating, or reduction by irradiation.

4. The method, as recited in claim 3, wherein the etching the metal, comprises:

providing a chemical reaction of the metal in the metal containing layer; and sputtering the chemically reacted metal in the metal containing layer.

5. The method, as recited in claim 4, wherein the conditioning the chamber is performed waferless.

6. The method, as recited in claim 5, wherein the native state metal is either an elemental metal or an alloy of at least two elemental metals.

7. The method, as recited in claim 6, wherein the chamber has a power window and a Faraday shield, which reduces residue deposited on the power window.

8. The method, as recited in claim 7, wherein the Faraday shield is grounded so that more residue is deposited on the Faraday shield than on the power window, and wherein the conditioning the chamber converts metal residue deposited on the Faraday shield to native state metal.

9. The method, as recited in claim 1, wherein the etching the metal, comprises:

providing a chemical reaction of the metal in the metal containing layer; and sputtering the chemically reacted metal in the metal containing layer.

10. The method, as recited in claim 1, wherein the conditioning the chamber is performed waferless.

11. The method, as recited in claim 1, wherein the chamber has a power window and a Faraday shield, which reduces residue deposited on the power window.

12. A method for reducing contamination in an etch chamber, comprising:

placing a substrate with a metal containing layer in the etch chamber;

etching the metal containing layer, producing nonvolatile metal residue deposits on surfaces of the etch chamber, wherein some of the metal residue of the metal residue is in a first state;

removing the substrate from the etch chamber; and conditioning the chamber by converting metal residue in the first state to metal residue in a second state, where metal residue in the second state has stronger adhesion to surfaces of the etch chamber than metal residue in the first state, wherein the chamber has a power window and a Faraday shield, which reduces residue deposited on the power window, wherein the Faraday shield is grounded so that more residue is deposited on the Faraday shield than on the power window, and wherein the conditioning the chamber converts metal residue deposited on the Faraday shield to native state metal.

13. A method for reducing contamination in an etch chamber, comprising:

placing a substrate with a metal containing layer in the etch chamber;

etching the metal containing layer, producing nonvolatile metal residue deposits on surfaces of the etch chamber, wherein some of the metal residue of the metal residue is in a first state;

removing the substrate from the etch chamber; and conditioning the chamber by converting metal residue in the first state to metal residue in a second state, where metal residue in the second state has stronger adhesion to surfaces of the etch chamber than metal residue in the first state, wherein the conditioning the chamber comprises providing an oxidation to convert the metal residue to a metal oxide and providing a reduction to convert the metal oxide to native state metal.

14. The method, as recited in claim 13, wherein the native state metal is either an elemental metal or an alloy of at least two elemental metals.

15. The method, as recited in claim 14, wherein the providing a reduction is at least one of providing a hydrogen reduction, reduction by heating, or reduction by irradiation.

16. A method for reducing contamination in an etch chamber with a power window and a Faraday shield adjacent to the power window, comprising:

placing a substrate with a metal containing layer in the etch chamber;

etching the metal containing layer, producing nonvolatile metal residue deposits on surfaces of the etch chamber including the Faraday shield, wherein the metal residue comprises a metal hydride or metal nitride, wherein the etching comprises:

providing a chemical reaction of the metal in the metal containing layer; and sputtering the chemically reacted metal in the metal containing layer;

removing the substrate from the etch chamber; and conditioning the chamber by converting metal residue which comprises the metal hydride or a metal nitride to a native state metal, where native state metal has stronger adhesion to surfaces of the etch chamber than the metal hydride or metal nitride, comprising:

providing an oxidation to convert the metal nitride or metal hydride to a metal oxide; and providing a reduction to convert the metal oxide to native state metal.

17. The method, as recited in claim 16, wherein the providing a reduction is at least one of providing a hydrogen reduction, reduction by heating, or reduction by irradiation.

18. The method, as recited in claim 17, wherein the conditioning the chamber is performed waferless.

* * * * *